(12) United States Patent
Osswald et al.

(10) Patent No.: US 11,287,290 B2
(45) Date of Patent: Mar. 29, 2022

(54) MODULAR FIELD DEVICE

(71) Applicant: Endress+Hauser SE+Co. KG, Maulburg (DE)

(72) Inventors: Dirk Osswald, Schopfheim (DE); Eric Bergmann, Steinen (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 51 days.

(21) Appl. No.: 16/797,852

(22) PCT Filed: Aug. 21, 2018

(86) PCT No.: PCT/EP2018/072527
§ 371 (c)(1),
(2) Date: Feb. 21, 2020

(87) PCT Pub. No.: WO2019/038266
PCT Pub. Date: Feb. 28, 2019

(65) Prior Publication Data
US 2020/0249056 A1 Aug. 6, 2020

(30) Foreign Application Priority Data
Aug. 24, 2017 (DE) ...................... 10 2017 119 358.8

(51) Int. Cl.
*G01D 11/24* (2006.01)
*H01R 13/627* (2006.01)
(Continued)

(52) U.S. Cl.
CPC ........... *G01D 11/245* (2013.01); *G01D 11/24* (2013.01); *G01D 11/26* (2013.01); *G01D 11/30* (2013.01);
(Continued)

(58) Field of Classification Search
CPC ...... G01D 11/24; G01D 11/245; G01D 11/30; G01D 11/26; G01L 19/14
(Continued)

(56) References Cited

U.S. PATENT DOCUMENTS 4,691,574 A * 9/1987 Delatorre .............. G01L 9/0072
361/283.4
5,043,841 A * 8/1991 Bishop .................. G01L 9/0089
361/283.4
(Continued)

FOREIGN PATENT DOCUMENTS

| CN | 1639924 A | 7/2005 |
|---|---|---|
| CN | 1874664 A | 12/2006 |

(Continued)

*Primary Examiner* — Clayton E. LaBalle
*Assistant Examiner* — Kevin C Butler
(74) *Attorney, Agent, or Firm* — Christopher R. Powers; Endress+Hauser (USA) Holding Inc.

(57) ABSTRACT

The invention relates to a modular field device, which is simply and safely assemblable. For this, the field device comprises: a housing having an electrical plug contact arranged in a housing interior, a mechanical securement, which is embodied to secure a first electronic component in the housing interior, a second electronic component, which is arrangeable in the housing interior and which is electrically contactable with the plug contact, and an elastic connection, which is embodied to connect the first electronic component elastically with the second electronic component. A division of tasks between two electronic components enables a modular design of the field device with universally applicable electronic components. In addition, the elastic connection provides a simple, mechanical securement of the first electronic component in the housing with simultaneous, safe, electrical connection of the second electronic component with the plug contact.

8 Claims, 3 Drawing Sheets

(51) Int. Cl.
    *H05K 5/02*         (2006.01)
    *H05K 7/14*         (2006.01)
    *G01D 11/26*       (2006.01)
    *G01D 11/30*       (2006.01)
    *G01L 19/14*       (2006.01)

(52) U.S. Cl.
    CPC .......... *G01L 19/14* (2013.01); *H01R 13/6278* (2013.01); *H05K 5/0217* (2013.01); *H05K 7/14* (2013.01)

(58) Field of Classification Search
    USPC .......................................................... 73/431
    See application file for complete search history.

(56) References Cited

U.S. PATENT DOCUMENTS

| | | | | |
|---|---|---|---|---|
| 5,625,152 A * | 4/1997 | Pandorf | ................ | G01L 9/0072 |
| | | | | 73/756 |
| 6,023,978 A * | 2/2000 | Dauenhauer | ............ | G01L 9/045 |
| | | | | 338/42 |
| 6,986,285 B2 | 1/2006 | Avisse | | |
| 2002/0083774 A1 * | 7/2002 | Poulin | .................... | G01L 19/14 |
| | | | | 73/708 |
| 2005/0145035 A1 * | 7/2005 | Kopp | ...................... | G01L 19/14 |
| | | | | 73/756 |
| 2008/0003889 A1 | 1/2008 | Link | | |
| 2011/0234208 A1 * | 9/2011 | Hofmockel | ........... | F02D 11/106 |
| | | | | 324/207.2 |
| 2011/0247420 A1 * | 10/2011 | Humpert | ................ | G01L 19/14 |
| | | | | 73/700 |
| 2013/0086990 A1 * | 4/2013 | Hugel | ..................... | G01L 19/14 |
| | | | | 73/774 |
| 2013/0125647 A1 * | 5/2013 | Lopatin | ................ | B01J 20/3007 |
| | | | | 73/431 |
| 2015/0016075 A1 * | 1/2015 | Ruf | ......................... | G01F 15/14 |
| | | | | 361/752 |

FOREIGN PATENT DOCUMENTS

| | | | | |
|---|---|---|---|---|
| CN | 101420831 A | 4/2009 | | |
| CN | 103985570 A | 8/2014 | | |
| CN | 104040302 A | 9/2014 | | |
| CN | 204231121 U | 3/2015 | | |
| CN | 204810809 U | 11/2015 | | |
| CN | 105472951 A | 4/2016 | | |
| DE | 10316032 A1 | 10/2004 | | |
| DE | 102011088302 A1 * | 6/2013 | ............ | G01F 15/14 |
| DE | 102011088302 A1 | 6/2013 | | |
| WO | 2016180635 A1 | 11/2016 | | |

* cited by examiner

MODULAR FIELD DEVICE

CROSS-REFERENCE TO RELATED APPLICATIONS

The present application is related to and claims the priority benefit of German Patent Application No. 10 2017 119 358.8, filed on Aug. 24, 2017 and International Patent Application No. PCT/EP2018/072527, filed on Aug. 21, 2018, the entire contents of which are incorporated herein by reference.

TECHNICAL FIELD

The invention relates to a modular field device, which is simply and safely assemblable.

BACKGROUND

In automation technology, for example, for large industrial process plants, field devices are often applied, which serve for registering relevant process parameters of process media. Suitable measuring principles are applied for registering the process parameters. Corresponding sensors are applied in, among others, fill level measuring devices, flowmeters, pressure- and temperature measuring devices, pH, redox potential, measuring devices, conductivity measuring devices, etc. They register relevant process parameters in containers or tubes, in which a process medium is located, parameters such as fill level, flow, pressure, temperature, pH value, redox potential, conductivity or dielectric constant. A large number of these field devices are produced and sold by the firm, Endress+Hauser.

Increasingly, field devices are being modularly designed. This means for field devices that different field device types, types such as, for example, pressure measuring devices and fill level measuring devices, are partially constructed from the same components. Advantageously, the application of equal components in different field device types concerns, above all, electronic components, which perform higher functions, such as, for example, communication or measurement data processing. A modular design of individual components can bring about significant cost reduction in the development and manufacturing logistics of new field device types.

However, the modular design of a field device type can make its assembly more difficult, since the number of components, especially electronic components, increases while the space available in the housing interior of the field device remains unchanged. At the same time, the individual electronic components must be electrically and/or mechanically contacted both with one another, as well as also with the housing interior. Thus, a more complex, installed situation makes the assembling more difficult.

SUMMARY

An object of the invention, therefore, is to provide a modular field device, which is simply and safely assemblable.

The invention achieves this object with a field device, comprising:

A housing having
  an electrical plug contact arranged in a housing interior,
  a mechanical securement, which is embodied to secure a first electronic component in the housing interior,
  a second electronic component, which is arrangeable in the housing interior and which is electrically contactable with the plug contact, and
  an elastic connection, which is embodied to connect the first electronic component elastically with the second electronic component.

A division of tasks between two electronic components enables a modular design of the field device with universally applicable electronic components. In addition, the elastic connection enables a mechanical securement of the first electronic component in the housing with simultaneous electrical connection of the second electronic component with the plug contact. Inherently, the electrical plug contact and the mechanical securement of the first electronic component additionally mechanically secures the second electronic component in the housing interior, without requiring that the second electronic component must be directly accessible. In such case, the elastic connection offers the special advantage that the force, which acts during the assembly on the electrical plug contact, is reduced. In this way, danger of damage is reduced and, thus, the assembling is, as a whole, safer, especially in the case of component tolerance related, geometrical deviations of the housing and/or the electronic components.

In order to reduce the force on the plug contact during the securement of the electronic components in the housing sufficiently, the elastic connection is advantageously so designed that it permits a spring movement between the first electronic component and the second electronic component of at least 2 mm. The particular design of the elastic connection of the invention is not limited. The elasticity can be achieved, for example, by providing that the elastic connection comprises, arranged between the first electronic component and the second electronic component, at least one elastic component, for example, a suitable elastomeric material having a defined geometry, or a spring element such as, for example, a leaf spring, helical spring or Belleville spring having an appropriate spring constant.

A first possibility for implementing the securement function of the mechanical connection provides that the elastic connection includes at least one headed stud on the first electronic component or on the second electronic component, and a corresponding engagement opening for the stud on the other electronic component. Advantageously, there are especially at least three studs. In such case, the engagement openings can be embodied, such that the first electronic component is connected to and/or released from the second electronic component either by means of a rotational movement or a translatory movement.

An alternative opportunity for implementing the securement function provides that the elastic connection comprises at least one snap fit hook on the first electronic component or on the second electronic component, and a corresponding engagement protrusion for the snap fit hook on the other electronic component. In such case, the at least one snap fit hook and the corresponding engagement protrusion are preferably designed releasably, in order in the case of a defective electronic component to enable replacement.

The danger of damage to the plug contact can further be reduced, when at least one portion of the housing interior, and an outer contour of the first electronic component and/or an outer contour of the second electronic component, are designed as a guide of the first electronic component and/or as a guide of the second electronic component, in order to contact the second electronic component to the plug contact. In such case, another possible further development provides that the guide comprises an end stop for the first electronic component or the second electronic component. The end stop can especially be embodied as a ledge in the housing inner wall. In this way, it can be enabled that the guide and the end stop are designed with accurate fit for mechanical securement of the first electronic component (with simultaneous contacting of the second electronic component with the plug contact).

BRIEF DESCRIPTION OF THE DRAWINGS

The invention will now be explained in greater detail based on the appended drawing, the figures of which show as follows.

DETAILED DESCRIPTION

Figure 1:
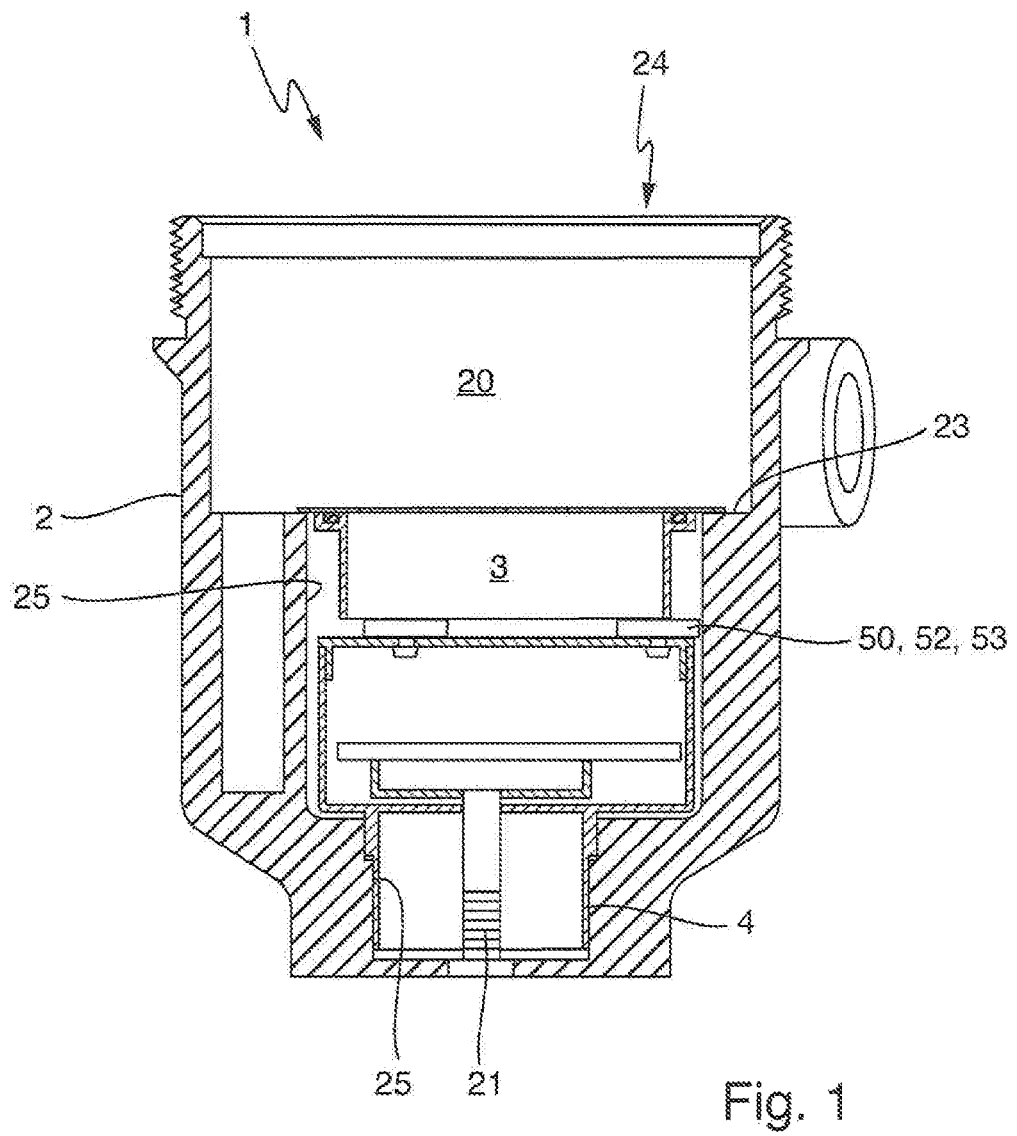
FIG. 1 shows a field device of the present disclosure.

FIG. 1 shows a housing 2 for a modularly constructed field device 1 having two electronic components 3, 4. In such case, a typical construction of the electronic components 3, 4 provides, as a rule, that each includes at least one electronics printed circuit board, which, in turn, is encapsulated, for example, in an appropriate (plastic-) box and/or potting material.

Housing 2 of the field device 1 includes in the housing interior 20 a plug contact 21, which serves for electrical connection of the second electronic component 4 arranged in the housing interior 20. Thus, via the plug contact 21, an electrical connection of the second electronic component 4 to the outside of the housing 2 can be implemented. Especially in the case of embodiment of the plug contact 21 as a high frequency capable, coaxial plug, such can be utilized, for example, in order, in the case of radar based, fill level measurement, to drive an antenna arranged outside of the housing 2 by means of the second electronic component 4. Likewise, the plug contact 21 can, however, also be applied as a data interface of the field device 1 to a superordinated unit, such as a process control station. In such case, of course, the second electronic component 4 is to be designed with a socket appropriate for the particular design of the plug contact 21.

As a result of the modular design, the field device 1 shown in FIG. 1 includes, besides the second electronic component 4, also a first electronic component 3. In such case, the first electronic component 3 is connected with the second electronic component 4 via an elastic connection 50, 52, 53. A mechanical securement 22, 23 provided for securing the first electronic component 3 in the housing interior 20 as well as an electronic contacting between the first electronic component 3 and the second electronic component 4 are not shown in detail in FIG. 1. A possible design of the mechanical securement 22, 23 can be based on a ledge 23 on the inner wall of the housing 2. In such case, the ledge 23 can function as an end stop for the first electronic component 3, and the first electronic component 3 can be secured to the ledge 23 by suitable means, for example, by means of a screwed connection 22 (see FIG. 3).

The assembly of the field device 1 is simplified by the elastic connection 50, 52, 53 of the invention between the two electronic components 3, 4. In such case, a first variant of the assembly provides that the first electronic component 3 is connected with the second electronic component 4 via the elastic connection 50, 52, 53 before installation in the housing interior 20, and then the two electronic components 3, 4 are introduced into the housing interior 20 via a housing opening 24. In such case, the second electronic component 4 is first contacted with the plug contact 21 and then the first electronic component 3 is mechanically secured in the housing interior 20.

In a second variant of the assembly, first, the second electronic component 4 is introduced separately, without the first electronic component, via the housing opening 24 into the housing interior 20 and contacted with the plug contact 21. Then, the first electronic component 3 is brought into the housing interior 20 via the housing opening 24 and, with appropriate design of the elastic connection 50, 52, 53, connected mechanically with the second electronic component 4. Also in the case of this variant, lastly, the first electronic component 3 is mechanically secured in the housing interior 20 (for example, by means of the screwed connection of FIG. 3).

In the case of both variants of assembly, the elastic connection 50, 52, 53 of the invention provides the advantage that force acting on the sensitive plug contact 21 during the securement of the first electronic component 3 to the housing interior 20 is reduced, above all in cases where the mechanical securement 22 of the first electronic component 3 is, due to component- and production tolerances, not arranged exactly at its preferred position. This especially reduces the danger of damaging the plug contact 21 during the assembly. This provides, as a whole, a simplified assembly. After the assembly, the elastic connection 50, 52, 53 provides during operation, moreover, the advantage that the plug contact 21 contacts with a defined, steady prestress, due to the elastic connection 50, 52, 53. Thus, a possible loose connection is prevented. This increases the operational safety of the field device 1.

The danger of damage to the plug contact 21 during assembly can be further reduced, when at least one portion of the housing interior 20, the corresponding outer contour of the first electronic component 3 and/or the corresponding outer contour of the second electronic component 4 are/is designed as a guide 25 of the first electronic component 3 and/or the second electronic component 4. In such case, the guide 25 is preferably so designed that the second electronic component 4 during the assembly after entering into the guide 25 is compelled to correctly engage with the plug contact 21. In such case, the ledge 23 can serve not only as part of the mechanical securement 22 of the first electronic component 3, but, also, with appropriate arrangement also as an end stop 23 of the guide 25.

Figure 2A:
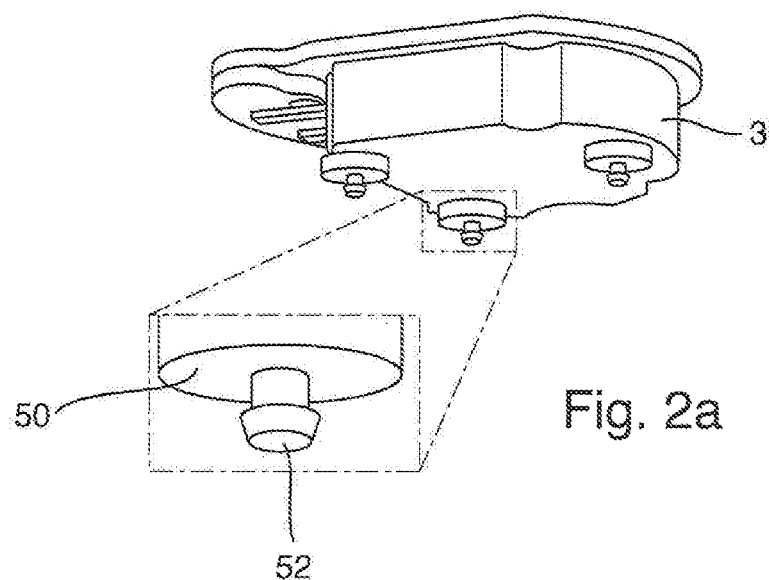
FIG. 2 shows a first embodiment of the elastic connection.
Figure 2B:
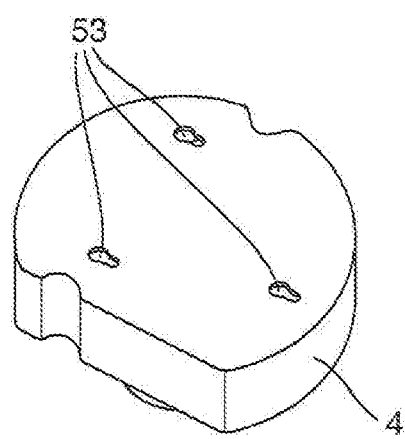
Figure 2C:
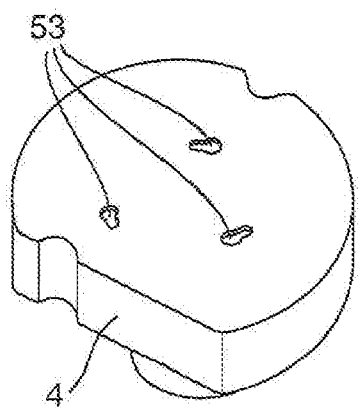

FIG. 1 indicates a first design of the elastic connection 50, 52, 53. As shown in FIGS. 2a, 2b and 2c in further detail, this design of the elastic connection 50, 52, 53 is based on three, headed studs 52 on the first electronic component 3 and corresponding engagement openings 53 on the second electronic component 4. This combination of studs and engagement openings provides the actual mechanical securement. An opposite arrangement of the studs 52 on the second electronic component 4 would likewise be an option. Also the application of more or less than three studs 52 is, of course, not excluded. For assuring the elasticity of the elastic connection 50, 52, 53, an elastic component 50 (for example, an elastomeric washer) is provided around each stud 52. In such case, the length of each stud 52 relative to the thickness of the elastic component 50 is so dimensioned that a corresponding spring movement of the elastic connection 50, 52, 53 (as regards the separation between the two electronic components 3, 4) is preferably greater than 2 mm.

As can be seen from FIGS. 2b and 2c, implementing the elastic connection 50, 52, 53 based on studs 53 provides the opportunity for designing the engagement openings 53 such that the first electronic component 3 is connectable with, or releasable from, the second electronic component 4 either by translation (FIG. 2b) or by rotation (FIG. 2c).

Figure 3:
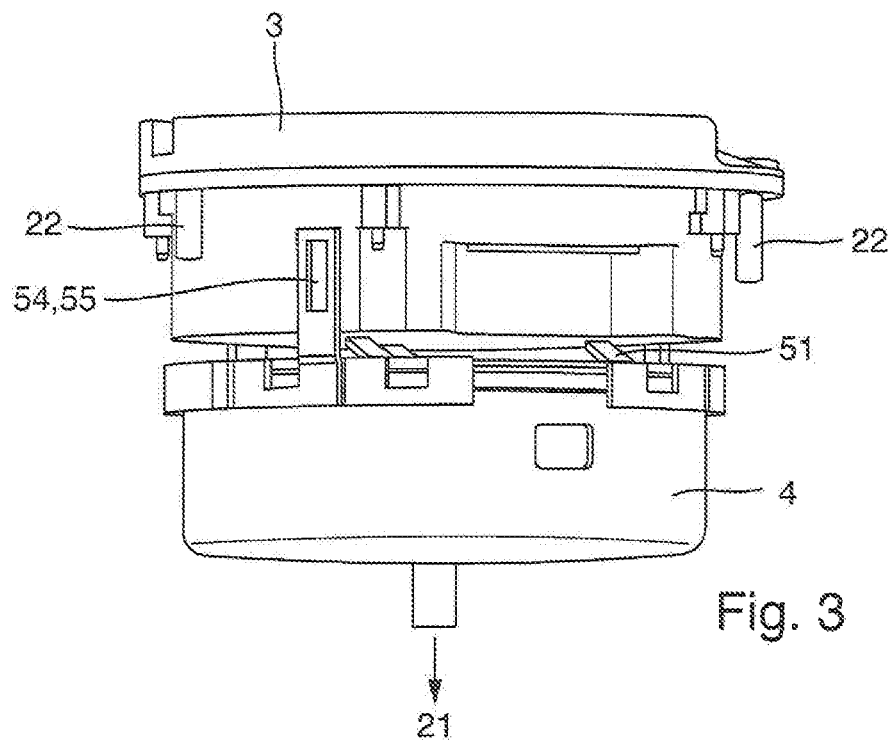
FIG. 3 shows a second embodiment of the elastic connection.

An alternative design of the elastic connection 51, 54, 55 is shown in FIG. 3. In the case of the design of FIG. 3, the mechanical connection between the first electronic component 3 and the second electronic component 4 is effected via three snap fit hooks 54. In the case of the embodiment shown in FIG. 3, three snap fit hooks 54 are arranged on the second electronic component 4 and so oriented relative to the first electronic component 3 that the snap fit hooks 54 engage on corresponding engagement protrusions 55 on the outer contour of the first electronic component 3. Three spring elements 51, which are arranged between the two electronic components 3, 4, provide resilience in the connection 51, 54, 55. For allowing the spring movement, the snap fit hooks 54 have corresponding openings for the engagement protrusions 55, which enables a shifting of the engagement protrusions 55 within the openings by at least the desired spring movement.

The embodiment shown in FIG. 3 shows an additional variant of the invention, in the case of which the spring elements 51 and snap fit hooks 54 are implemented as one, continuous, plastic component, wherein this plastic component is pushed as a cap onto the second electronic component 4.

Figure 4:
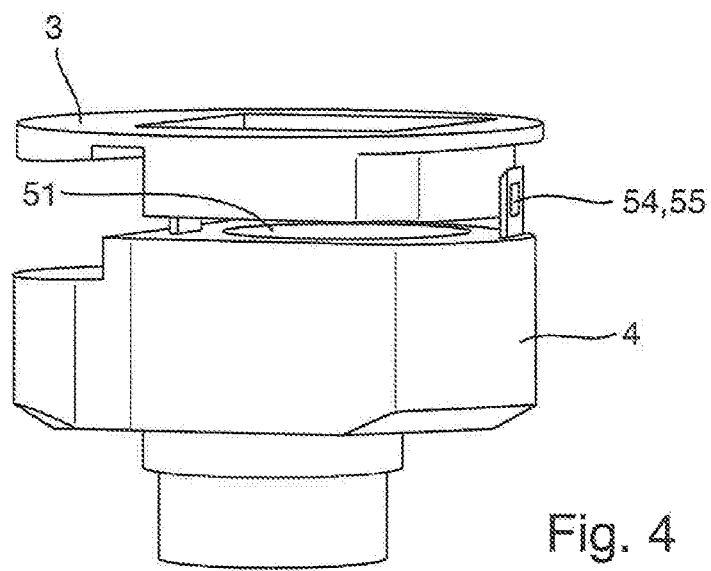
FIG. 4 shows a third embodiment of the elastic connection.

FIG. 4 shows that at least in the case of application of snap fit hooks 54 also a Belleville spring can be applied as spring element 51.

LIST OF REFERENCE CHARACTERS 1 field device
2 housing
3 first electronic component
4 second electronic component
20 housing interior
21 electrical plug contact
22 screwed connection
23 ledge
24 housing opening
25 guide
50 elastic component
51 spring element
52 studs
53 engagement opening
54 snap fit hook
55 engagement protrusion

The invention claimed is:

1. A field device, comprising:
a housing having a housing interior;
an electrical plug contact arranged in the housing interior;
a first electronic component disposed in the housing interior;
a second electronic component disposed in the housing interior and electrically contacting the electrical plug contact;
an elastic connection connecting the first electronic component elastically with the second electronic component; and
a mechanical securement securing the first electronic component to the housing interior;
wherein the elastic connection comprises at least one elastic component or spring element arranged between the first electronic component and the second electronic component.

2. The field device as claimed in claim 1, wherein the elastic connection is so designed that it permits a displacement of the first electronic component relative to the second electronic component of at least 2 mm.

3. The field device as claimed in claim 1, wherein the elastic connection comprises at least one headed stud on the first electronic component or on the second electronic component and a corresponding engagement opening for the stud on the other electronic component.

4. The field device as claimed in claim 3, wherein the engagement opening is embodied such that the first electronic component is connected to and/or released from the second electronic component by means of a rotational movement or a lateral movement.

5. The field device as claimed in claim 1, wherein the elastic connection includes at least one snap fit hook on the first electronic component or on the second electronic component and a corresponding engagement protrusion for the snap fit hook on the other electronic component.

6. The field device as claimed in claim 1, wherein at least one portion of the housing interior and an outer contour of the first electronic component and/or an outer contour of the second electronic component, are designed as a guide for the first electronic component and/or the second electronic component, in order to contact the second electronic component to the plug contact.

7. The field device as claimed in claim 6, wherein the guide includes an end stop.

8. The field device as claimed in claim 7, wherein the guide and the end stop are designed with accurate fit for mechanical securement of the first electronic component.

* * * * *